(12) United States Patent
Baars et al.

(10) Patent No.: US 8,647,952 B2
(45) Date of Patent: Feb. 11, 2014

(54) ENCAPSULATION OF CLOSELY SPACED GATE ELECTRODE STRUCTURES

(75) Inventors: Peter Baars, Dresden (DE); Richard Carter, Dresden (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 322 days.

(21) Appl. No.: 12/974,037

(22) Filed: Dec. 21, 2010

(65) Prior Publication Data

US 2012/0153398 A1 Jun. 21, 2012

(51) Int. Cl.
*H01L 21/336* (2006.01)
(52) U.S. Cl.
USPC .... 438/300; 438/587; 438/595; 257/E21.177; 257/E21.19; 257/E21.64
(58) Field of Classification Search
USPC .......................... 438/199, 233, 300, 587, 595; 257/E21.177, E21.19, E21.64
See application file for complete search history.

(56) References Cited

U.S. PATENT DOCUMENTS

| | | | | |
|---|---|---|---|---|
| 5,665,616 A | * | 9/1997 | Kimura et al. | 438/234 |
| 5,731,242 A | * | 3/1998 | Parat et al. | 438/586 |
| 5,998,273 A | * | 12/1999 | Ma et al. | 438/305 |
| 6,022,771 A | * | 2/2000 | Ma et al. | 438/230 |
| 6,433,871 B1 | * | 8/2002 | Lensing et al. | 356/450 |
| 7,151,023 B1 | * | 12/2006 | Nayfeh et al. | 438/231 |
| 7,172,944 B2 | * | 2/2007 | Kwon | 438/304 |
| 7,569,443 B2 | * | 8/2009 | Kavalieros et al. | 438/183 |

\* cited by examiner

*Primary Examiner* — Evan Pert
(74) *Attorney, Agent, or Firm* — Amerson Law Firm, PLLC

(57) ABSTRACT

Generally, the subject matter disclosed herein relates to sophisticated semiconductor devices and methods for forming the same, wherein the pitch between adjacent gate electrodes is aggressively scaled, and wherein self-aligning contact elements may be utilized to avoid the high electrical resistance levels commonly associated with narrow contact elements formed using typically available photolithography techniques. One illustrative embodiment includes forming first and second gate electrode structures above a semiconductor substrate, then forming a first layer of a first dielectric material adjacent to or in contact with the sidewalls of each of the first and second gate electrode structures. The illustrative method further includes a step of forming a second layer of a second dielectric material on the first layer, followed by forming a third layer of a third dielectric material on the second layer, wherein forming the third layer further comprises forming a first horizontal portion of the third layer above a surface of the semiconductor substrate between the first and second gate electrode structures.

27 Claims, 7 Drawing Sheets

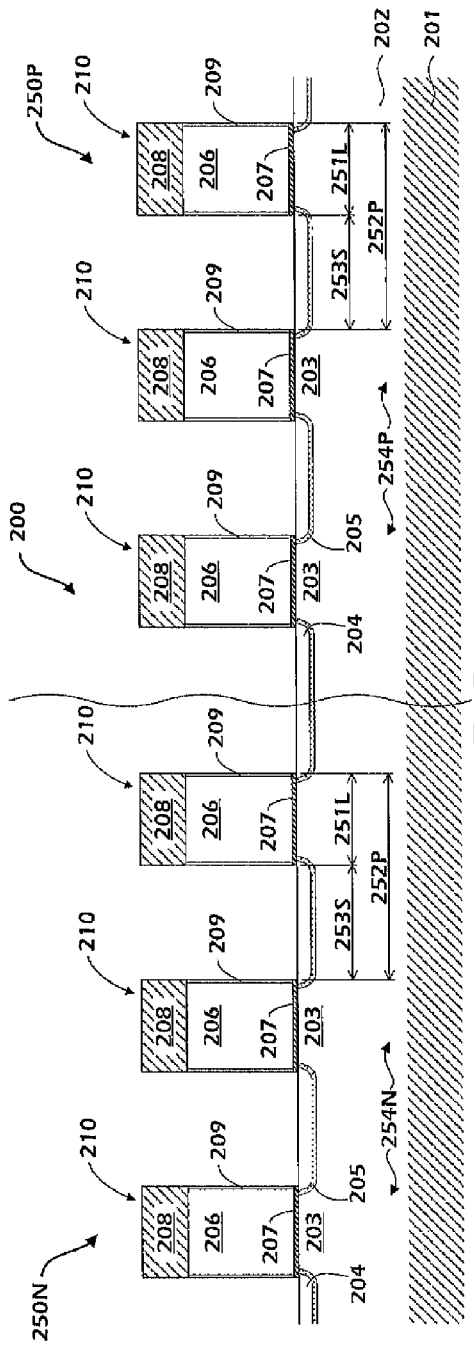
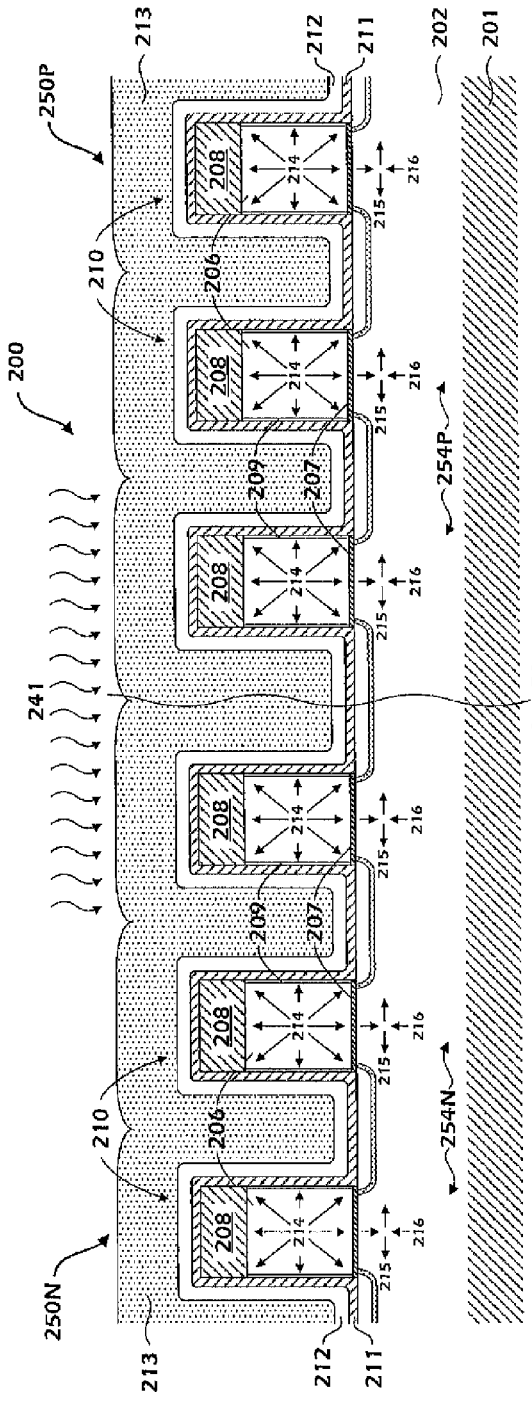
Fig. 2a
Fig. 2b

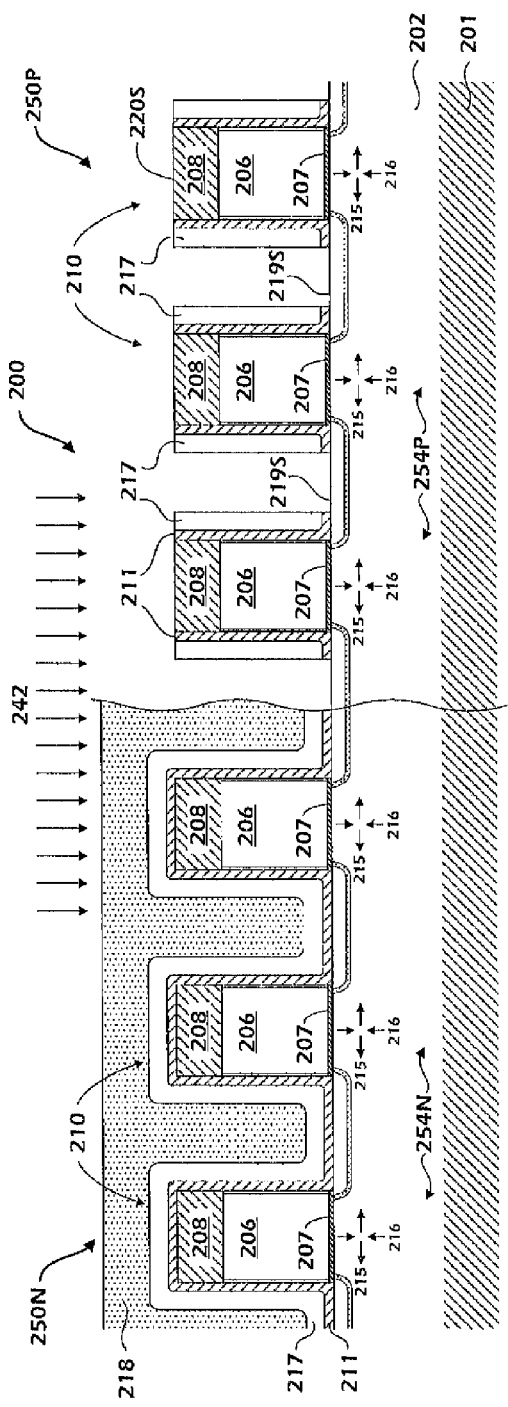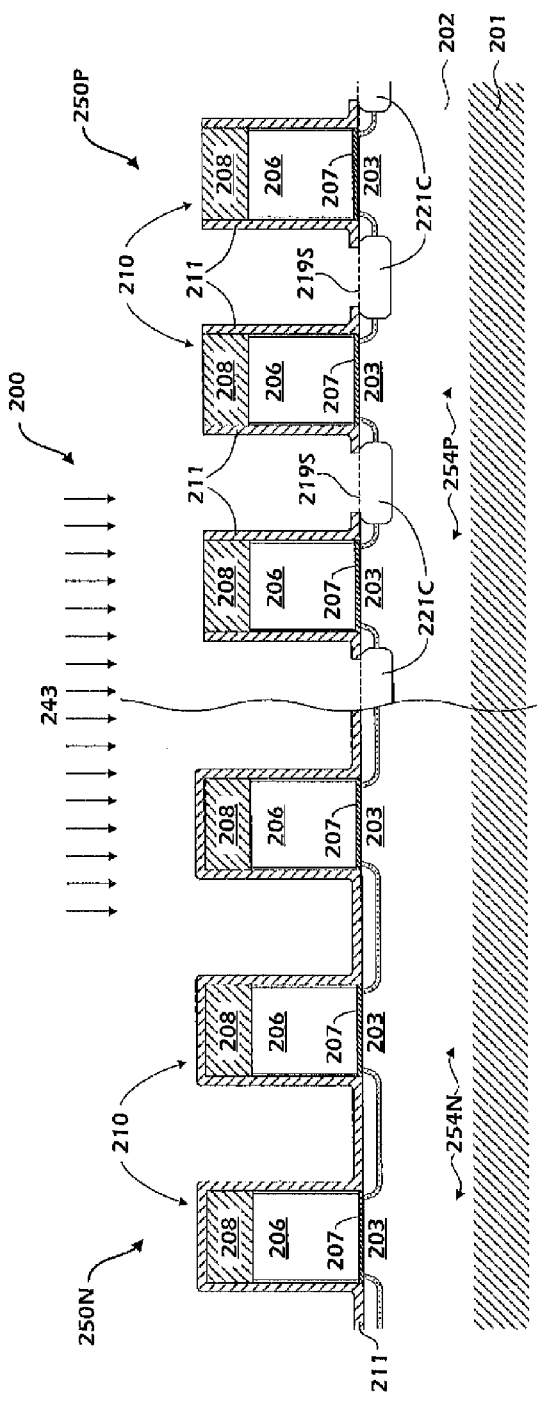

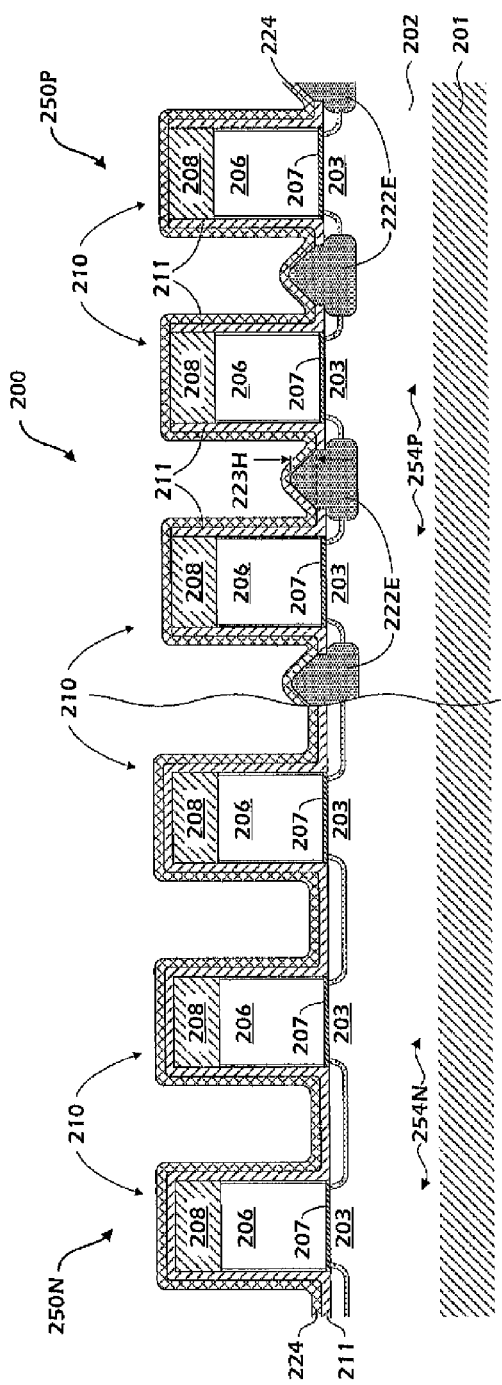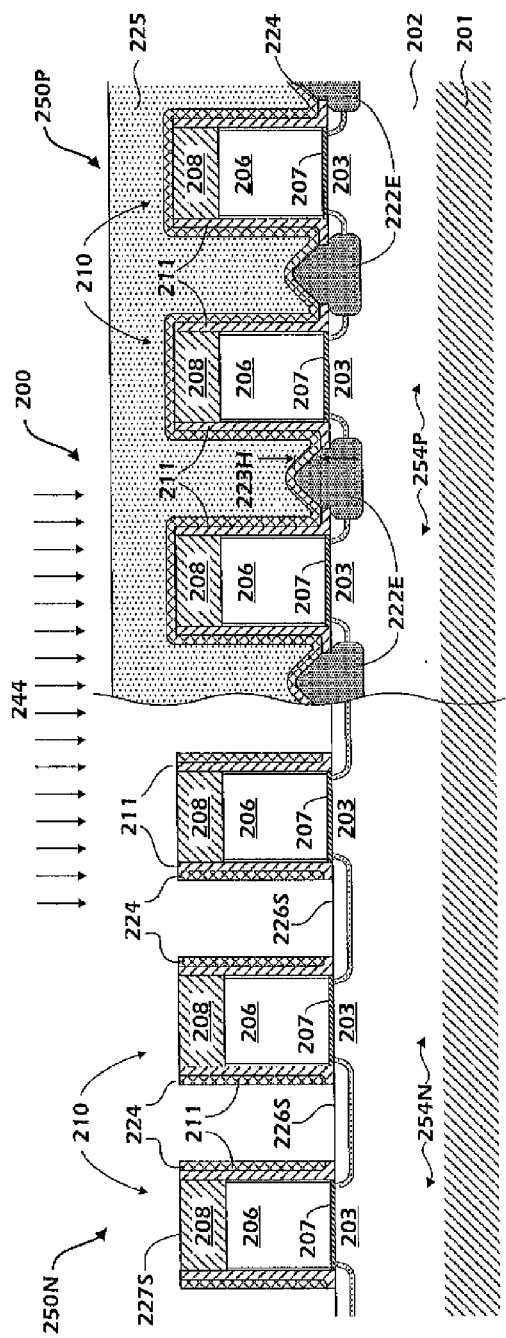

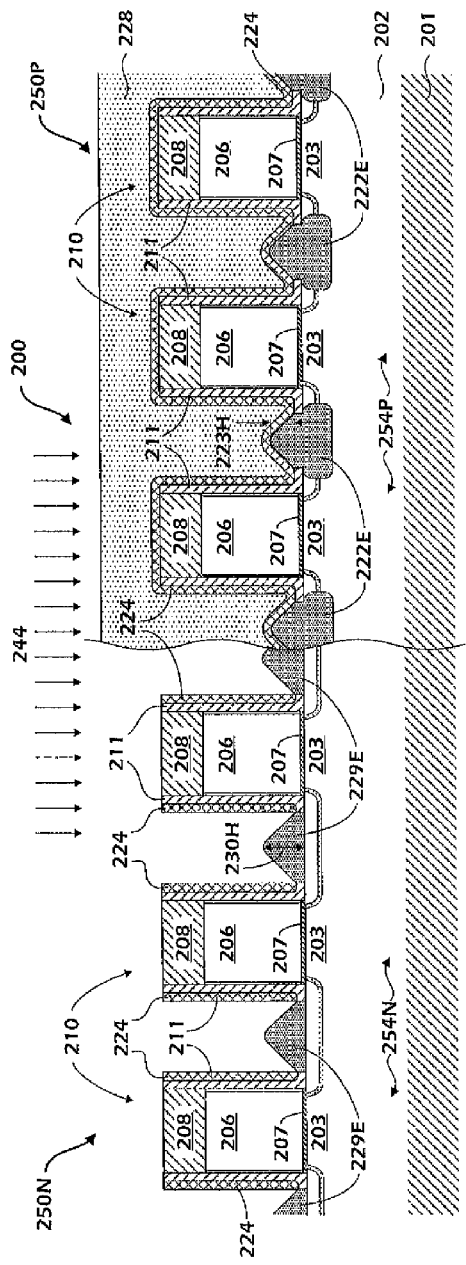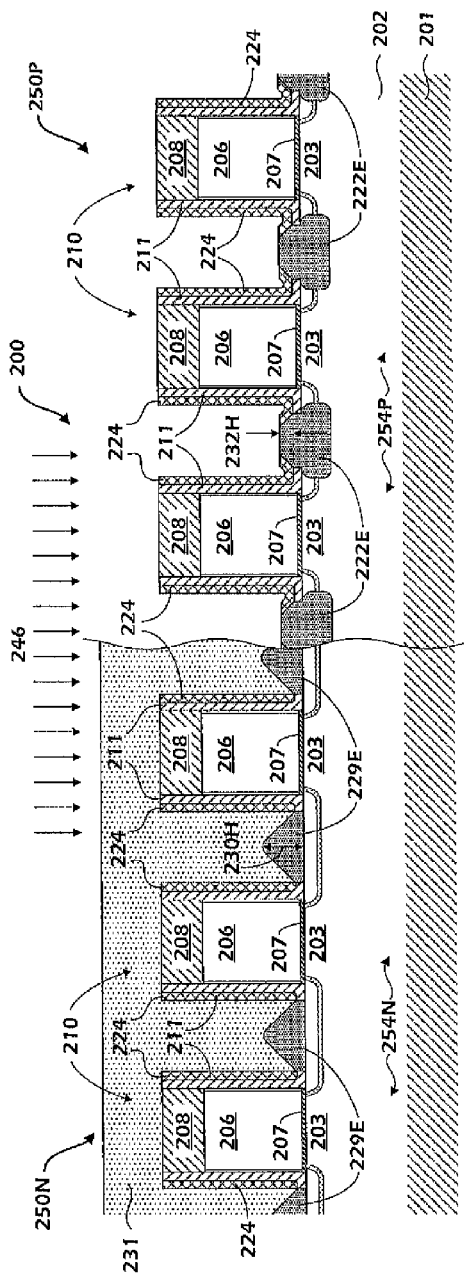

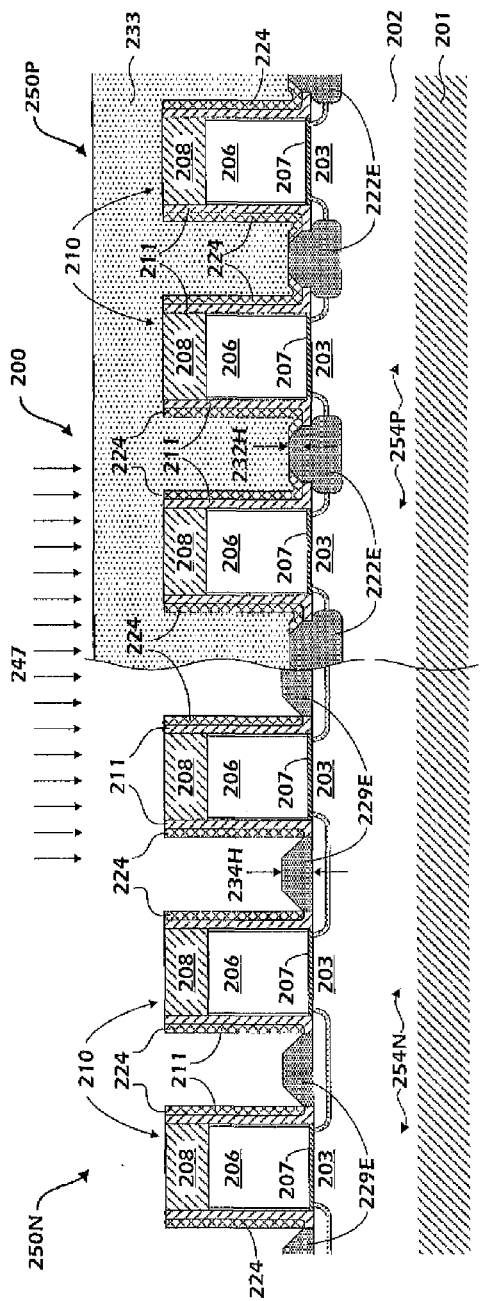
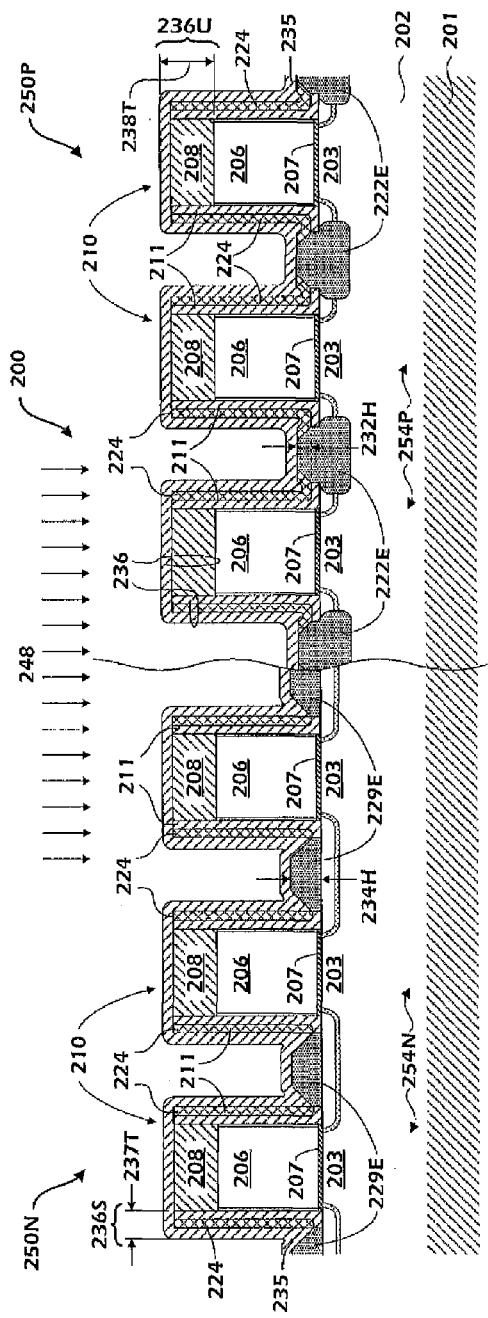

ENCAPSULATION OF CLOSELY SPACED GATE ELECTRODE STRUCTURES

BACKGROUND

1. Field of the Disclosure

Generally, the present disclosure relates to sophisticated integrated circuits, and, more particularly, to closely spaced gate electrode structures having full nitride encapsulation.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. Generally speaking, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate. Accordingly, the electrical resistance of conductive contact elements becomes a significant issue in the overall transistor design, since the cross-sectional area of these elements is similarly decreased. Moreover, the cross-sectional area of the contact vias, together with the characteristics of the materials they comprise, may have a significant influence on the effective electrical resistance and overall performance of these circuit elements.

As integrated circuits become smaller and more closely spaced—i.e., as the number of circuit elements that are packed within a given unit area of a semiconductor device substrate increases—the greater the number of interconnections that are required between these circuit elements. Furthermore, it is not uncommon for the number of required interconnects to increase in a non-linear fashion relative to the number of circuit elements, such that the amount of real estate available for interconnects becomes even further limited, thus increasing the likelihood that the cross-sectional area of critical conductive elements might be further reduced.

Presently, integration schemes used for manufacturing transistor elements based on the current design technology node (e.g., 32/28 nm) permit the use of photolithography processes which can readily achieve a resist patterning that allows the formation of adequately sized contact elements—i.e., contact elements having acceptable electrical resistance characteristics—while still maintaining a robust minimum spacing between the contact elements and adjacent gate electrodes. With respect to FIGS. 1a-1b, one illustrative embodiment of a prior art semiconductor device utilizing such a contact element configuration will now be described.

FIG. 1a schematically shows a cross-sectional view of an illustrative semiconductor device 100 comprising a substrate 101, in and above which transistor elements 150a and 150b may be formed with a gate pitch 152P. As is well known in the art, gate pitch 152P is generally understood to be the lateral distance measured from the left-most sidewall of the gate electrode material 106 of the transistor element 150a to the left-most sidewall of the gate electrode material 106 of the transistor element 150b The substrate 101 may represent any appropriate substrate on which may be formed a semiconductor layer 102, such as a silicon-based layer, or any other appropriate semiconductor material that facilitates the formation of the transistor elements 150a, 150b. It should be appreciated that the semiconductor layer 102, even if provided as a silicon-based layer, may include other materials, such as germanium, carbon and the like, in addition to an appropriate dopant species for establishing the requisite conductivity type in an active region (not shown) of the semiconductor layer 102. Furthermore, in some illustrative embodiments, transistor elements 150a, 150b may be formed as bulk transistors, i.e., the semiconductor layer 102 may be formed on or be part of a substantially crystalline substrate material, while in other cases specific device regions of the device 100 or the entire device 100 may be formed on the basis of a silicon-on-insulator (SOI) architecture, in which a buried insulating layer (not shown) may be provided below the semiconductor layer 102.

As shown in FIG. 1a, each of the transistor elements 150a, 150b may comprise a gate electrode structure 110 having a gate length 151L and a lateral space 153S between adjacent gates. Gate electrode structure 110 may include, for instance, a gate dielectric material 107, such as a silicon dioxide based gate dielectric and the like, above which may be formed a gate electrode material 106, such as a polysilicon material and the like. Highly doped source and drain regions 104, including extension regions 105 that usually comprise a dopant concentration less than the highly doped regions 104, may also be formed in an active region of the semiconductor layer 102. The source and drain regions 104, including the extension regions 105, are laterally separated by a channel region 103, which is electrically and physically isolated from the gate electrode material 106 by the gate dielectric material 107.

Sidewall spacer structures 111 having an overall thickness 154T may also be provided on the sidewalls of the gate electrode structures 110. Depending on the process strategy, the sidewall spacer structures 111 may include two or even more spacer elements, such as offset spacers, conformal liners, and the like. FIG. 1a depicts one illustrative embodiment, wherein the sidewall spacer structures 111 each comprise an offset spacer 111a, conformal liner or spacer 111b, and a spacer element 111c. Furthermore, the gate electrode structures 110 may also comprise a metal silicide contact region 112 to facilitate electrical connectivity, and similar metal silicide contact regions 113 may be formed in the drain and source regions of the transistor elements 150a, 150b.

The semiconductor device 100 as shown in FIG. 1a may be formed on the basis of well-established process techniques. For instance, the gate electrode structures 110 may be formed on the basis of sophisticated deposition and/or oxidation techniques for forming the gate dielectric material 107, wherein an appropriate thickness and material type, such as silicon dioxide, may be selected depending on device requirements. Thereafter, sophisticated lithography and etch techniques may be used for forming the gate electrode material 106, which, in some illustrative may comprise polysilicon and the like.

Next, the sidewall spacer structures 111 may be formed, at least partially, so as to act as an appropriate implantation mask for creating the lateral dopant profile for the drain and source regions 104 and extension regions 105. Offset spacers 111a, if required, may be comprised of any appropriate dielectric material, such as silicon dioxide, and may be formed as follows. In some illustrative embodiments, the dielectric material layer may be conformally deposited over the semiconductor device 100 by an appropriate deposition process, such as low pressure chemical vapor deposition (LPCVD) or atomic layer deposition (ALD). In other illustrative embodiments, the dielectric material layer may be formed by exposing the surfaces of the semiconductor device 100 to an appropriate oxidizing ambient. Thereafter, the dielectric material layer may be anisotropically etched to remove horizontal portions of the layer so as to form the offset spacers 111a.

Further, the sidewall spacer structure 111 may comprise a conformal liner or spacer 111b, which may be formed to exhibit a substantially L-shaped configuration. That is, the conformal spacer 111b may comprise a portion of a specified thickness that extends along the sidewall of the gate electrode 106 and may also comprise a portion having substantially the same thickness that extends along a part of the semiconductor layer 102, in which the source/drain and extension regions 104, 105 are to be formed. Consequently, the conformal spacer 111b may have a shape which substantially corresponds to the shape of the gate electrode 106, with a "horizontal" portion extending along a part of the drain and source regions 104, thereby separating one or more additional spacer elements 111c from the gate electrode 106 and the source/drain and extension regions 104, 105.

As shown in FIG. 1a, the sidewall spacer structure 111 may further comprise a sidewall spacer element 111c which may be formed using well known techniques. For example, in some illustrative embodiments, sidewall spacer element 111c may be formed of a dielectric material that may exhibit a significant etch selectivity with respect to the dielectric material of the conformal spacer 111b in view of a specific etch recipe so as to enable a selective removal of the spacer element 111c while substantially maintaining the conformal spacer 111b. For example, in one illustrative embodiment, the conformal or L-shaped spacer 111b may be comprised of silicon dioxide, while spacer element 111c may be comprised of silicon nitride. However, other regimes for the spacers 111b and 111c may be contemplated. For instance, in another illustrative embodiment, the L-shaped spacer 111b may be comprised of silicon nitride, while the spacer element 111c may be formed of silicon dioxide.

Prior to the deposition and/or removal of respective portions of the sidewall spacer structure 111, various implantation processes may be performed in order to obtain the required lateral dopant profile in the extension regions 105, and in the source/drain regions 104. It should be appreciated that a plurality of implantation processes may be required, such as pre-amorphization implantation, halo implantation, extension implantation and deep drain and source implantations for obtaining the required complex dopant profile. Furthermore, during the formation of the transistor structures 150a, 150b as shown, one or more high temperature treatments may be required, for instance, for activating dopants and re-crystallizing implantation-induced damage and the like. Finally, the metal silicide regions 112 and 113 may be formed in a common process based on well-known deposition, annealing, and etching techniques.

FIG. 1b shows the semiconductor device 100 of FIG. 1a in a further advanced stage of manufacturing. As shown in FIG. 1b, a contact etch stop layer 114 may be formed above transistor elements 150a, 150b so as to facilitate formation of a contact via 119 using techniques that are well known in the art, and as will be discussed in detail below. Thereafter, an interlayer dielectric material 116 of a first metallization layer may be deposited above the semiconductor device 100. Etch stop layer 114 may, in some illustrative embodiments, comprise a material that provides a suitable etch selectivity with respect to the interlayer dielectric material 116. For example, the interlayer dielectric material 116 may, in some embodiments, comprise a silicon dioxide material, and may be formed using a non-conformal deposition process such as a spin-on glass (SOG) technique, and the like. In such embodiments, a suitable etch selectivity may be obtained with an etch stop layer 114 comprised of silicon nitride or silicon oxynitride material.

In some illustrative embodiments, a material layer having a specified intrinsic stress may be formed above the semiconductor device 100 so as to thereby enhance the performance of one or both of the transistor elements 150a, 150b. The intrinsic stress may either be a compressive stress or a tensile stress, depending on the specified device characteristics and process requirements. In one embodiment, etch stop layer 114 may comprise the specified intrinsic stress, whereas in other embodiments an additional dielectric material layer 115 comprising the specified intrinsic stress may be deposited above etch stop layer 114 prior to forming interlayer dielectric material 116.

As further illustrated in FIG. 1b, an etch mask 117, such as a photoresist mask, may then be formed above interlayer dielectric material 116. The etch mask 117 may subsequently be patterned, using appropriate photolithography techniques, so as to define an opening 118 corresponding to the contact via opening 119 that is to be formed in the interlayer dielectric material 116. Thereafter, the contact via opening 119 may be formed based on an appropriately designed anisotropic etch process 120, such as a reactive ion etch (RIE) process and the like, recipes for which are well known in the art.

Based on the current design technology node, one illustrative embodiment of the semiconductor device 100 utilizes a nominal gate length 151L of approximately 32 nm, which in some instances may result an actual gate length in the range of 35-40 nm. With a nominal gate length 151L of 32 nm, the gate pitch 152P may in some cases be on the order 130 nm, thereby leaving a lateral space 153S between adjacent gates of approximately 90 nm. Moreover, in some process strategies, wherein the overall thickness 154T of the sidewall spacer structures 111 may range from 10-30 nm, the remaining lateral space 155S available between adjacent gate electrode structures 110 (including sidewall spacer structures 111) may be reduced to approximately 40-60 nm. Nonetheless, 40-60 nm leaves an acceptable amount of space for using available photolithography techniques to form an adequately-sized contact via opening 119 having a width in the range of 25-40 nm, which is more than sufficient to prevent the electrical resistance of the contact element from becoming unduly high.

However, it should be noted that, as the nominal size of design technology nodes decreases, it becomes increasingly difficult to utilize available photolithography techniques and still achieve a robust minimum spacing between a contact element and adjacent gate electrode structures without significantly reducing the real estate available for forming the actual contact element. For example, aggressively sized transistor elements based on a 20 nm design technology node may have a nominal gate length of 26 nm, resulting in an actual gate length that is on the order of 28-30 nm. Furthermore, the gate pitch 154P may be reduced to approximately 80 nm. When implementing a process strategy that requires a total gate sidewall spacer thickness of as little as 10-16 nm, the remaining lateral space 155S between adjacent gate electrode structures may be reduced to as low as approximately 25 nm. Based on available photolithography techniques, such a small available space may lead to contact element widths in the range of 10-15 nm, thereby resulting in unacceptably high contact element resistance levels.

Accordingly, there is a need to implement new design strategies to address both the manufacturing and performance issues associated with integration schemes for aggressively sized transistor elements. The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to sophisticated semiconductor devices and methods for forming the same, wherein the pitch between adjacent gate electrodes is aggressively scaled, and wherein self-aligning contact elements may be utilized to avoid or at least reduce the high electrical resistance levels commonly associated with narrow contact elements formed using typically available photolithography techniques. One illustrative embodiment disclosed herein includes forming first and second gate electrode structures above a semiconductor substrate, then forming a first layer of a first dielectric material adjacent to or in contact with the sidewalls of each of the first and second gate electrode structures. The illustrative method further includes a step of forming a second layer of a second dielectric material on the first layer, followed by forming a third layer of a third dielectric material on the second layer, wherein forming the third layer further comprises forming a first horizontal portion of the third layer above a surface of the semiconductor substrate between the first and second gate electrode structures.

Another illustrative method disclosed by the present subject matter includes forming a plurality of first and second gate electrode structures in and above first and second active regions, respectively, of a semiconductor substrate, then forming a first layer of a first dielectric material above the first and second active regions, wherein at least a first portion of the first layer covers sidewall surfaces of each of the first and second gate electrode structures. Furthermore, the method includes the steps of forming a second layer of a second dielectric material above the first layer, and forming a third layer of a third dielectric material above said first and second layers, wherein at least a first portion of the second layer covers the first portion of the first layer, and at least a first portion of the third covers the first portions of the first and second layers.

An illustrative semiconductor device is disclosed herein, which includes a plurality of NMOS transistor elements, wherein each of the plurality of NMOS transistor elements comprises a first gate electrode structure above a first active region of a semiconductor substrate. Additionally, at least two of the plurality of first gate electrode structures comprise a first encapsulating stack, wherein the first encapsulating stack comprises a first dielectric cap layer and a first sidewall spacer stack. Furthermore, the first sidewall spacer stack comprises at least three separately formed dielectric material layers. The illustrative semiconductor device also comprises a plurality of PMOS transistor elements, wherein each of said plurality of PMOS transistor elements comprises a second gate electrode structure above a second active region of the semiconductor substrate. Moreover, at least two of the plurality of second gate electrode structures comprise a second encapsulating stack, the second encapsulating stack comprises a second dielectric cap layer and a second sidewall spacer stack, and the second sidewall spacer stack comprises at least three separately formed dielectric material layers.

Yet another illustrative semiconductor device disclosed by the present subject matter comprises a first gate electrode structure above an active region of a semiconductor substrate and a second gate electrode structure above the active region and adjacent to the first gate electrode structure. Furthermore, each of the first and second gate electrode structures comprise a dielectric cap layer above a gate electrode material, a first layer of a first dielectric material adjacent to or in contact with sidewalls of the gate electrode material, and a second layer of a second dielectric material on the first layer. Additionally, the illustrative semiconductor device comprises a third layer of a third dielectric material on the second layer, wherein the third layer further comprises a first horizontal portion above the active region between the first and second gate electrode structures, and the first horizontal portion of the third layer comprises an opening that exposes the active area. The device further comprises a conductive material in the opening, wherein the conductive material contacts the exposed active area.

One illustrative semiconductor device disclosed herein comprises a plurality of NMOS transistor elements, each comprising a first gate electrode structure formed above a first active region of a semiconductor layer based on a first pitch dimension. Furthermore, at least one first gate electrode structure of the illustrative device includes a first encapsulating layer comprising a first cap layer and first sidewall spacer stack, wherein the first sidewall spacer stack comprises at least three separately formed material layers, and wherein the first cap layer and each of the three separately formed material layers of the first sidewall spacer stack comprise a first dielectric material. The illustrative semiconductor device further includes a plurality of PMOS transistor elements, each PMOS transistor comprising a second gate electrode structure formed above a second active region of the semiconductor layer based on a second pitch dimension. Finally, at least one of the second gate electrode structures of the illustrative device includes a second encapsulating layer comprising a second cap layer and second sidewall spacer stack, wherein the second sidewall spacer stack comprises at least three separately formed material layers, and wherein the second cap layer and each of the three separately formed material layers of the second sidewall spacer stack comprise the first dielectric material.

BRIEF DESCRIPTION OF THE DRAWINGS

The disclosure may be understood by reference to the following description taken in conjunction with the accompanying drawings, in which like reference numerals identify like elements, and in which:

FIGS. 2a-2k schematically illustrate a process flow of an illustrative embodiment of the subject matter disclosed herein.

Figure 1A:
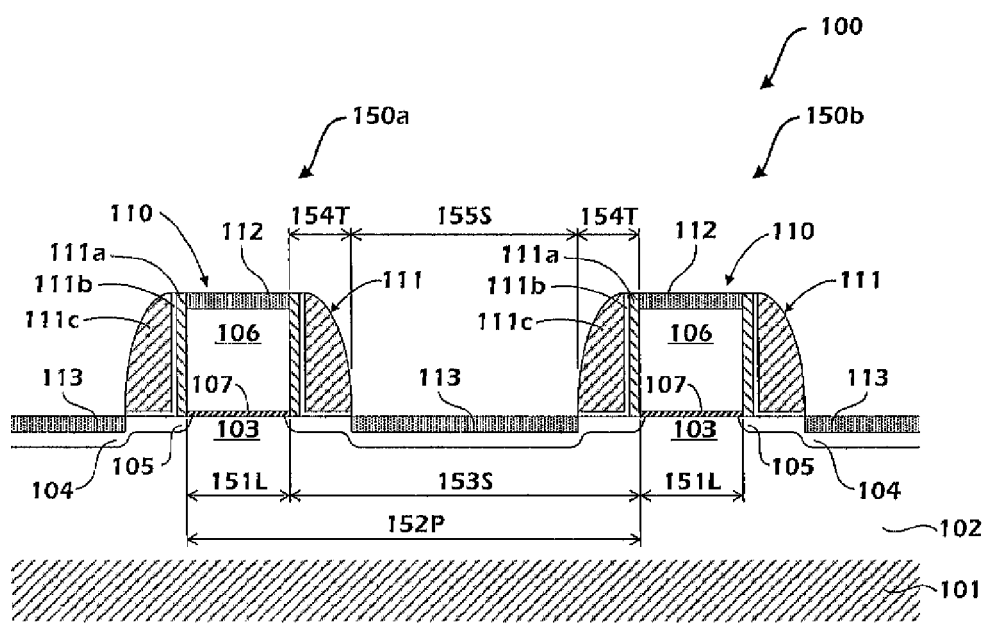
FIGS. 1a-1b schematically illustrate a process flow of an illustrative prior art method for forming contact elements in a semiconductor device.
Figure 1B:
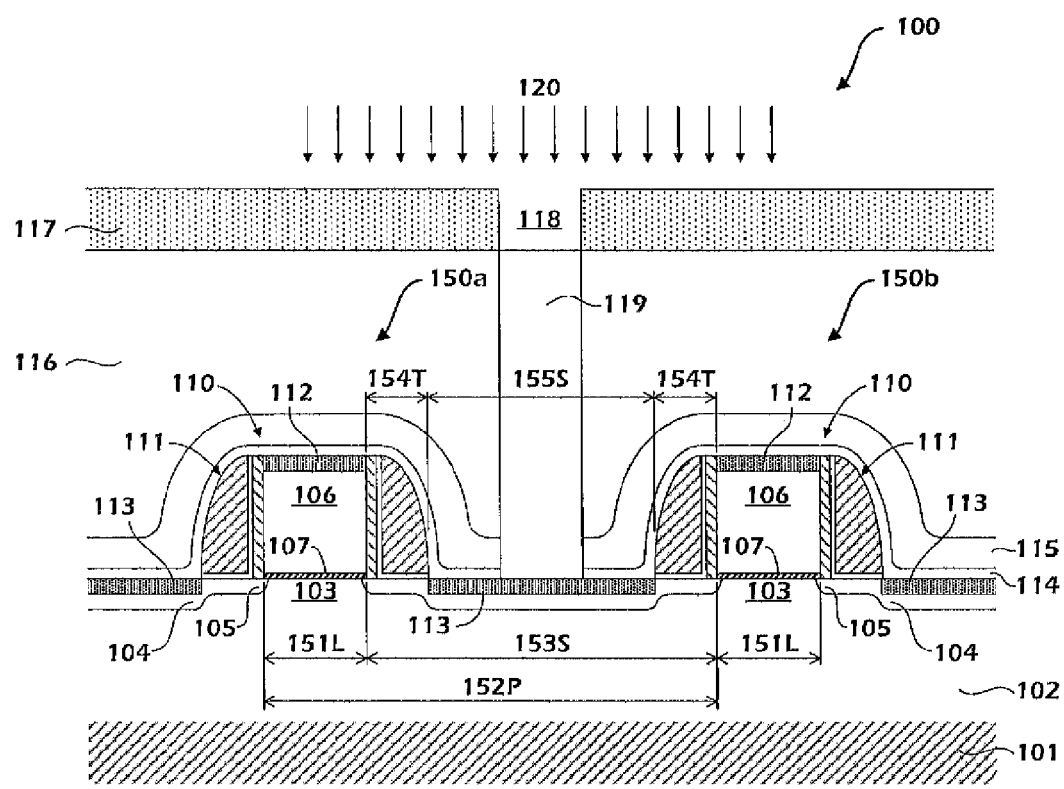

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides manufacturing techniques and semiconductor devices in which the gate electrodes pitch is less than 100 nm. Due to the stringent photolithography requirements necessary to ensure that an acceptable and robust minimum spacing is maintained between adjacent gate electrodes and any contact elements formed between the gate electrodes, efforts to aggressively scale the gate electrode pitch to values less than 100 nm is extremely challenging. While the photolithography techniques employed in some integration schemes, such as 35 nm, permit the formation of adequately sized contact elements, there are indications that smaller integration schemes result in contact element dimensions that are too small, resulting in unacceptably high electrical resistances. Accordingly, a process sequence that includes, among other things, self-aligned contact elements is proposed to circumvent, or at least reduce the effects of, the reduced space that may be available between adjacent gate electrodes having a gate pitch of less than 100 nm.

Additionally, various materials and integration schemes may be used with the subject matter disclosed herein. such materials may include, among other things, metal gate electrode materials such as titanium nitride (TiN), titanium aluminum nitride (TiAlN), titanium silicon nitride (TiSiN) and the like, and high-k gate dielectric materials, such as tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like. It should be noted that the term "high-k dielectric material" as it is used in the present disclosure comprises materials having a dielectric constant k greater than 10.

Other materials may also include, for example, epitaxially formed semiconductor materials such as silicon, silicon-carbon (SiC), silicon-germanium (SiGe) and the like, which may be formed in the source and/or drain regions of transistor elements. Furthermore, and depending on the specific device requirements, a dual epitaxy integration scheme—i.e., wherein materials may be epitaxially formed in the NMOS and/or PMOS regions of the semiconductor device based on different criteria and/or during different process steps—may also be employed.

To facilitate integration of the high-k dielectric/metal gate electrode (HK/MG) configuration into the device process sequence, the gate electrode stack may, in some cases, be completely sealed off from all sources of oxygen and wet etch chemistries after the gate patterning step has been completed, so as to avoid the introduction of defects which may be associated with the oxidation of the metal gate. In accordance with the present disclosure, when a gate-first HK/MG process sequence is contemplated, this sealing step may be accomplished by fully encapsulating the gate electrode stack with a layer of an appropriate dielectric material, thus effectively sealing the metal gate electrode from oxidation effects. In the gate-first HK/MG integration scheme, and to avoid any substantial degradation associated with exposure of the metal gate material to aggressive cleaning chemistries, or to oxygen or oxygen-containing materials, the dielectric material used to encapsulate the gate electrode stack may be, for example, silicon nitride. Furthermore, when the transistor element comprises a conventional gate electrode structure (i.e., a polysilicon gate material formed above a silicon dioxide or silicon oxynitride gate dielectric) or when a replacement gate process sequence is contemplated (i.e., a dummy gate electrode comprising a sacrificial material, such as polysilicon, is formed first, and subsequently removed), the above-noted full dielectric encapsulation of the gate stack acts to prevent, or reduce, any parasitic epitaxial growth on the gate material in those illustrative embodiments when a semiconductor material may be epitaxially formed in the source and/or drain regions of the transistor element.

The present disclosure thus contemplates the full encapsulation of the gate electrode stack with an appropriate dielectric material irrespective of the gate electrode stack integration scheme that may be employed—e.g., a conventional polysilicon/silicon dioxide gate stack, a full metal gate stack, a gate-first HK/MG scheme, or gate-last (i.e., replacement gate) HK/MG scheme. Additionally, and so as to facilitate a full and robust encapsulation of the gate electrode stack for the dual epitaxy scheme, the present disclosure teaches a full encapsulation method which may comprise forming three separate dielectric material layers on the gate electrode stack. Moreover, to enable the integration of forming self-aligned contact elements, each of the three separate dielectric material layers may comprise the same dielectric material, which may exhibit a significant etch selectivity with respect to an interlayer dielectric fill material comprising the metallization layer formed above the semiconductor device. The methods disclosed herein may also be compatible with transistor element integration processes incorporating stress-induced performance enhancement schemes, such as stressed overlayers, stress memorization techniques, and the like.

FIG. 2a shows a schematic cross-sectional view of an illustrative semiconductor device 200 of the present disclosure that corresponds to a manufacturing stage wherein initial gate electrode patterning steps have been substantially completed. The semiconductor device 200 of FIG. 2a may include, in some embodiments, a substrate 201, which may be a silicon substrate or any other appropriate substrate on which may be formed a semiconductor layer 202, such as a silicon-based layer, or any other appropriate semiconductor material. The semiconductor layer 202 may, in some illustrative embodiments, comprise a first active region 254N in and above which may be formed a plurality of NMOS transistor elements 250N, and a second active region 254P in and above which may be formed a plurality of PMOS transistor elements 250P. In some embodiments, first and second active regions 254N, 254P may be defined by a trench isolation structure (not shown), as may commonly be used in devices of this type. First active region 254N may comprise a suitable concentration of P-type dopant material so as to provide the proper device conductivity, such as boron and the like, whereas second active region 254P may a comprise a suitable concentration of N-type dopant material, such as, for example, phosphorous or arsenic.

It should be appreciated that the semiconductor layer 202, even if provided as a silicon-based layer, may include other materials, such as germanium, carbon and the like, in addition to an appropriate dopant species for establishing the requisite conductivity type in the active regions 254N, 254P as discussed above. Furthermore, in some illustrative embodiments, transistor elements 250N, 250P may be formed as bulk transistors, i.e., the semiconductor layer 202 may be formed on or be part of a substantially crystalline substrate material, while in other cases specific device regions of the semiconductor device 200 may be formed on the basis of a silicon-on-insulator (SOI) architecture, in which a buried insulating layer (not shown) may be provided below the semiconductor layer 202.

Each transistor element 250N, 250P may comprise a gate electrode structure 210, which, in the manufacturing stage shown in FIG. 2a, may further comprise a gate electrode material 206 formed above a gate dielectric layer 207, which separates the gate electrode 206 from a channel region 203. Furthermore, a dielectric cap layer 208 may also be formed above the gate electrode material 206, the material of which may depend on the desired process sequence and the specific type of gate electrode structures 210 comprising the transistor elements 250N, 250P, as will be explained in detail below.

In some illustrative embodiments of the present disclosure, the process strategy may comprise a full metal gate, and/or a gate-first HK/MG integration scheme. In such illustrative embodiments, the gate material 206 may comprise a suitable metal gate material such as titanium nitride (TiN), titanium aluminum nitride (TiAlN), titanium silicon nitride (TiSiN) and the like. Furthermore, for example, when a metal gate electrode is contemplated, the gate dielectric layer 207 may comprise an appropriately selected high-k gate dielectric material, such as tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

In other illustrative embodiments, the desired process strategy may include a conventional gate electrode stack integration scheme, wherein the gate electrode material 206 may comprise, for example, a polysilicon material, and the gate dielectric layer 207 may be comprised of a suitable material such as silicon dioxide, silicon oxynitride, a high-k material, and the like. In some integration schemes, the final gate electrode structure 210 utilized in the semiconductor device 200 may comprise the conventional polysilicon-silicon dioxide/oxynitride (poly/SiON) gate electrode stack. In other illustrative embodiments, a replacement gate integration scheme may be contemplated, wherein the conventional poly/SiON gate electrode stack may be a "dummy gate" that is removed during subsequent process steps and replaced with, for example, a high-k/metal gate electrode (HK/MG) structure.

In some illustrative embodiments, the gate electrode structure 210 may further comprise a liner 209 formed on the sidewalls of gate electrode material 206. For integration schemes wherein the gate electrode structure 210 comprises a conventional poly/SiON gate electrode stack as describe above, the liner 209 may comprise a thin dielectric material such as, for example, silicon dioxide, and the like. In some embodiments, the thin silicon dioxide liner 209 may be formed by exposing the gate electrode material 206 to a suitably designed oxidation process, such as an oxygen-containing plasma ambient and the like. Alternatively, the liner 209 may be formed by depositing a layer of silicon dioxide material over the gate electrode material 206 using a highly conformal deposition process, such as LPCVD or ALD. The thickness of the silicon dioxide liner 209 used in the conventional poly/SiON and/or replacement gate schemes may be on the order of, for example, 1-2 nm or even less.

For full metal gate electrode structures or gate-first HK/MG schemes, the liner 209 may comprise an ultra-thin dielectric material layer, such as silicon nitride and the like. In such embodiments, oxygen-containing dielectric materials such as silicon dioxide or silicon oxynitride would not be permissible due to the potential oxidation/oxygen contamination of the underlying metal gate. The ultra-thin liner 209 may be formed by depositing a layer of silicon nitride material to a thickness of 1 nm or less over the sidewalls of the gate electrode material 206 based on a highly conformal deposition process such as ALD or LPCVD.

In the manufacturing stage depicted in FIG. 2a, the transistor elements 250N, 250P may comprise lightly doped source/drain extension regions 204 separated by the channel region 203. Depending on specific device requirements, halo implantation regions 205 may also be present. Furthermore, when the process sequence comprises device performance enhancement via stress memorization techniques, an amorphization step may have been performed on areas of the semiconductor layer 202 adjacent the gate electrode structures 210 so as to amorphize the crystalline structure of the semiconductor material comprising the semiconductor layer 202. In some illustrative embodiments, the amorphization step may comprise an ion implantation sequence based on, for example, xenon or argon ions, which may be performed after completion of the gate electrode patterning sequence.

In some illustrative embodiments of the present disclosure, the nominal gate length 251L of at least some of the gate electrode structures 210 may be less than approximately 35 nm. For example, in certain embodiments, the nominal gate length 251L of at least some of the gate electrode structures 210 may be approximately 26 nm, wherein an actual gate length may be in the range of 28-30 nm. In further embodiments, at least some of the gate electrode structures may comprise a nominal gate length of even less than 26 nm.

Furthermore, in some illustrative embodiments, the gate electrode pitch 252P of at least some of the gate electrode structures 210 may be less than approximately 100 nm. Moreover, in certain embodiments of the present disclosure wherein the nominal gate length 251L of at least some of the gate electrode structures 210 may be, for example, approximately 26 nm, the gate electrode pitch 252P may be on the order of approximately 80 nm, thereby leaving a lateral space 253S between adjacent gate electrode structures 210 of approximately 50 nm. In yet further illustrative embodiments, the gate electrode pitch 252P of at least some of the gate electrode structures 210 may be less than 80 nm, thus leaving a lateral space 253S of less than 45 nm.

FIG. 2b illustrates the semiconductor device 200 of FIG. 2a in a further advanced manufacturing stage. As shown in FIG. 2a, a first dielectric material layer 211 may be formed above the transistor elements 250N, 250P using, for example, a highly conformal deposition process such as ALD, LPCVD, and the like. In some embodiments of the present disclosure, the first dielectric material layer 211 may be adjacent to, but possibly not in direct contact with, the sidewall of the gate electrode material 206. For example, in those embodiments wherein the liner 209 is first formed on the sidewalls of the gate electrode material 206 as previously described, the liner 209 may separate the first dielectric material layer 211 from the gate electrode material 206. However, in other illustrative embodiments, for example, wherein liner 209 is not included, the first dielectric material layer 211 may be in direct contact with the gate electrode material 206. Thus, as used herein, the phrase "adjacent to" does not require actual contact with the gate electrode material 206.

In some illustrative embodiments, the thickness of layer first dielectric material layer 211 may range between 3-6 nm, and in certain embodiments may be approximately 5 nm. Furthermore, depending on device strategies, the first dielectric material layer 211 may be comprised of a material having etch selectivity to the liner 209. For example, in a replacement gate (i.e., gate-last) integration scheme, the gate electrode material 206 must be selectively removable relative to the first dielectric material layer 211 in a subsequent process sequence. In such embodiments—wherein the liner 209 may be comprised of silicon dioxide—the layer 211 may comprise, for example, silicon nitride, thus providing the requisite etch selectivity with respect to the liner 209, and thereby facilitating the removal of the gate electrode material 206 without undue damage to the layer 211. In other illustrative embodiments, such as a full metal gate electrode and/or a gate-first HK/MG integration, etch selectivity with respect to the liner 209 may not be critical, as removal of the gate electrode stack at a later stage of device manufacture may not be required. In such embodiments, the material comprising the first dielectric material layer 211 may be selected based on an etch selectivity with respect to the interlayer dielectric fill material comprising a metallization layer formed above the semiconductor device 200 during a later manufacturing step, details of which will be further discussed below.

In some illustrative embodiments, and irrespective of the design strategy considerations outlined for the first dielectric material layer 211 above, the cap layer 208 may comprise substantially the same dielectric material (or at least one having the same etching characteristics) as that comprising the layer 211, thereby facilitating, among other things, the integration of self-aligned contact elements, as will later be outlined in further detail. Moreover, in some embodiments the cap layer 208 may have a thickness that is great enough to withstand each of the subsequent etch processes that may be performed so as to form the device embodiments illustrated in FIGS. 2c-2k and further described below. For example, in one illustrative embodiment the cap layer 208 may be approximately 45 nm thick.

For those embodiments of the present disclosure wherein a stress-induced device performance enhancement integration scheme is employed, one illustrative method comprising a process strategy directed to a stress memorization technique will now be described.

As shown in FIG. 2b, a first sacrificial etch stop layer 212 may be deposited on the first dielectric material layer 211. In certain embodiments, the material comprising the first sacrificial etch stop layer 212 may exhibit selective etch properties relative to the first dielectric material layer 211, thereby allowing the selective removal of the first etch stop layer 212 with respect to the layer 211 during a later manufacturing step, as will be outlined in further detail below. In those embodiments wherein the first dielectric material layer 211 comprises silicon nitride, the first etch stop layer 212 may comprise silicon dioxide. The first etch stop layer 212 may be deposited based on a highly conformal deposition process, such as ALD or LPCVD and the like, and to a minimum thickness as may be necessary to withstand a stripping process designed to remove a subsequently formed sacrificial silicon nitride material layer 213. In certain embodiments, the first etch stop layer 212 may have a thickness ranging from 1-5 nm, whereas in specific embodiments the thickness may be approximately 3 nm.

After forming the first etch stop layer 212, a sacrificial silicon nitride material layer 213 may then be deposited above the transistor elements 250N, 250P of the semiconductor device 200. In the illustrative embodiment shown in FIG. 2b, the sacrificial material layer 213 may be conformally deposited so as to completely fill the spaces between adjacent gate electrode structures 210. In other illustrative embodiments (not shown), the sacrificial material layer 213 may be deposited to a thickness in the range of approximately 12-16 nm. The sacrificial layer 213 be may deposited based on any one of several deposition techniques know in the art, such as ALD, LPCVD, or even PECVD (plasma enhanced chemical vapor deposition) and the like. Thereafter, an annealing process 241 may be performed so as to induce a memorized stress in the channel regions 203 of the transistor elements 250N, 250P, as described below. The specific time and temperature parameters of the annealing process 241 may depend on several device design considerations, such as, for example, gate electrode material, substrate material, desired stress levels, and the like. In some embodiments, the annealing process 241 may be a rapid thermal anneal (RTA), which may be performed at approximately 600° C. or higher, for approximately 2 minutes or longer. As noted, other annealing parameters may be employed depending on the overall device strategies.

While the precise mechanisms associated with the stress memorization technique are not fully understood, it is generally believed that the following explanation best describes the phenomenon. During the annealing process 241, the gate electrode material 206 and the silicon nitride material comprising the sacrificial material layer 213 will each seek to expand in accordance with that material's normal thermal expansion properties. Therefore, the gate electrode material 206, whether it comprises a conventional polysilicon material or a metal gate material, will typically try to expand (as indicated by arrows 214) more than the sacrificial silicon nitride material layer 213 surrounding it. However, due to the higher hardness and greater strength of the silicon nitride material layer 213 relative to the gate electrode material 206, and the fact that the higher strength silicon nitride material layer 213 effectively encloses the gate electrode structure 210 on the three sides, the gate electrode material 206 may plastically deform during the annealing process 241. Furthermore, the gate electrode material 206 may be forced to expand in the only direction that it is effectively unconstrained—i.e., downward toward the gate dielectric layer 207/channel region 203 interface. Once the annealing temperature is reduced and the transistor elements 250N, 250P are permitted to cool, the plastically deformed gate electrode material 206 maintains its deformed shape, thereby inducing a stress in the channel region below the gate dielectric layer, which comprises both a lateral (i.e., parallel to the gate dielectric layer)

tensile stress component 215 and a vertical (i.e., perpendicular to the gate dielectric layer) compressive stress component 216. Moreover, the induced stress remains in the channel region 203—i.e., the stress is "memorized" —even after to the overlying sacrificial silicon nitride material layer 213 has been removed.

While the process methods described in the present disclosure do not necessarily require the inclusion of specific steps directed to enhancing transistor performance based on stressed channel effects, it should be noted that stress techniques in general may have a significant influence on overall device performance. For example, in some embodiments, the stress memorization technique described above may increase device performance by 10-15% or more.

FIG. 2c illustrates the semiconductor device 200 in a further advance manufacturing stage. For those embodiments of the present disclosure wherein a stress memorization integration scheme is used as outlined above, the sacrificial silicon nitride material layer 213 has been stripped from above the transistor elements 250N, 250P by performing an appropriately designed dry or wet etch process. For example, in one illustrative embodiment, a hot phosphoric acid wet etch process may be performed so as to strip the sacrificial silicon nitride material 213. Furthermore, in some illustrative embodiments, when a dry etch process is used to strip the sacrificial silicon nitride layer 213, etch stop layer 212, when comprised of silicon dioxide, may be damaged. Thereafter the etch stop layer 212 should be selectively removed relative to the first dielectric material layer 211 based upon, for example, a suitably designed wet etch process, recipes for which are well known in the art.

Thereafter, a second sacrificial etch stop layer 217 may be formed above the transistor elements 250N, 250P as shown in FIG. 2c using a conformal deposition process such as ALD, LPCVD, and the like. As previously noted with respect to the first etch stop layer 212, the material comprising the second sacrificial etch stop layer 217 may exhibit selective etch properties relative to the first dielectric material layer 211, once again allowing the removal of the second etch stop layer 217 with respect to the layer 211 based on suitable wet etch chemistries well know in the art. In those embodiments wherein the first dielectric material layer 211 is comprised of silicon nitride, the second sacrificial etch stop layer 212 may comprise silicon dioxide. Furthermore, depending on the desired process strategy, the thickness of the second etch stop layer 217 may be adjusted as required to obtain the desired size (i.e., width and thickness) of an epitaxial spacer material that may be formed in the source/drain regions of the PMOS transistor elements 250P, as will later be discussed in conjunction with FIG. 2e below. In some illustrative embodiments, the thickness of the second etch stop layer 217 may be in the range of approximately 5-8 nm.

It should be noted that when a hot phosphoric acid wet etch process is used to strip sacrificial silicon nitride layer 213 from above the transistor elements 250N, 250P, the first sacrificial etch stop layer 212 may not be damaged, and therefore need not necessarily be removed from above the first dielectric material layer 211. In such cases, the second sacrificial etch stop layer 217 may be deposited above the first sacrificial etch stop layer 212, and the as-deposited thickness of the layer 217 may be adjusted such that the total thickness of the combined sacrificial etch stop layers 212 and 217 meets the overall thickness criteria outlined above.

After forming the second etch stop layer 217, portions of the layer 217 are thereafter selectively removed from above the PMOS transistor elements 250P. As shown in FIG. 2c, an etch mask 218 may be formed above the semiconductor device 200 so as to cover the NMOS transistor elements 250N and to expose the PMOS transistor elements 250P. Thereafter, the horizontal portions of the second etch stop layer 217—i.e., those portions formed above the second active region 254P and the cap layer 208—may be selectively removed based on a suitable anisotropic etch process 242, such as a reactive ion etch (RIE) and the like, whereas the vertical portions of the layer 217—i.e., those portions formed on the sidewalls of the gate electrode structures 210—may be left substantially in place. Furthermore, the etch process 242 may be adjusted such that horizontal portions of the first dielectric material layer 211 exposed during the selective removal of horizontal portions of the second etch stop layer 217 may also be removed from above the second active region 254P and the cap layer 208, thereby exposing upper surface portions 219S and 220S, respectively. Additionally, depending on the etch recipe and the desired process sequence, some portion of the cap layer 208 above the PMOS transistor elements 250P may also be removed during the etch process 242, thereby slightly reducing the thickness thereof. For example, the thickness of the cap layer 208 may be reduced in some illustrative embodiments by approximately 6-8 nm during the etch process 242.

FIG. 2d illustrates the semiconductor device 200 in yet a further advanced manufacturing state, wherein the etch mask 218 and the remaining portions of the second sacrificial etch stop layer 217 have been removed from above the device 200. As shown in FIG. 2d, a plurality of cavities 221C may be formed in the exposed surface portions 219S (see FIG. 2c) of the second active region 254P and adjacent to the gate electrode structures 210. In some illustrative embodiments, the cavities 221C may be formed by performing an isotropic etch process 243, which may be selective to the silicon-based semiconductor material comprising the second active region 254P. The first dielectric material layer 211 above the PMOS transistor elements 250P, as well as the "L-shaped" sidewall portions of the first dielectric layer 211 and the cap layer 208 remaining on the NMOS transistor elements 250N, may act as hardmask elements during the etch process 243. The etch process 243 may, in some embodiments, comprise a wet etch recipe, whereas in other embodiments it may comprise a dry etch recipe. For example, in one illustrative embodiment, the anisotropic etch process 243 may be a dry etch process based on hydrogen chloride gas. As shown in FIG. 2d, due to etch selectivity to the <111> silicon crystal plane, the cavities 221C may be "under-etched"—i.e., formed to some distance underneath the "L-shaped" portions of the first dielectric material layer 211 remaining on the sidewalls of the NMOS transistor elements 250N.

FIG. 2e shows the semiconductor device 200 in a further illustrative manufacturing stage, wherein an epitaxially grown silicon-based semiconductor material 222E has been formed in the cavities 221C. As shown in FIG. 2e, the epitaxial material 222E completely fills the cavities 221C, and is further grown to a height or thickness 223H above the upper surface 219S (see FIG. 2c) of the second active region 254P, thereby forming raised source/drain regions of the PMOS transistor elements 250P. In some illustrative embodiments, the silicon-based epitaxial material 222E may comprise, for example, a silicon-based semiconductor material that is substantially similar to the silicon-based material comprising the second active region 254P. In other embodiments, however, the epitaxial material 222E may comprise a material that is substantially different than the material comprising second active region 254P. For example, in some embodiments, the material of the second active region 254P may be substantially silicon, whereas the epitaxial material 222E may comprise a silicon-germanium (SiGe) material.

As is well known, during an epitaxial deposition process, the material comprising the silicon-based substrate acts as a "seed crystal." Therefore, during the epitaxial deposition process, silicon-based materials will only be formed on the exposed surfaces of silicon-containing semiconductor materials. On the other hand, surfaces that are covered by dielectric materials such as silicon nitride, silicon dioxide and the like, will be effectively "masked." Therefore, as shown in FIG. 2e, epitaxially grown material will not be formed on, for example, the first dielectric material layer 211 formed above the NMOS transistor elements 250N. Furthermore, epitaxially grown material will not be formed on the portions of the first dielectric material layer 211 remaining on the sidewalls of the gate electrode structures 210 of the PMOS transistor elements 250P, or on the cap layers 208 formed thereabove.

While, in general, the silicon-based material comprising the second active region 254P will act as a "seed layer" during epitaxial deposition, the epitaxially deposited material may also take on a lattice structure and crystal orientation that is substantially identical to those of the substrate material. Furthermore, atoms comprising a silicon-germanium material are larger than those comprising a material that is substantially silicon. Accordingly, when a silicon-germanium material is epitaxially formed on a substantially silicon material, the larger silicon-germanium atoms may induce a localized stress on the surrounding smaller atoms of the substantially silicon material. In this way, an epitaxial material 222E comprising silicon-germanium that may be formed in the cavities 221C may induce a compressive stress on the channel region 203 of the PMOS transistor elements 250P, which may thereby lead to improvement in the performance of the transistors 250P. On the other hand, it should be appreciated that, in those embodiments wherein the additional stress-induced performance improvement that may be derived from a silicon-germanium epitaxial material 222E is not required, the epitaxial material 222E may comprise a material that substantially matches that of the second active region 254P—e.g., that comprises substantially silicon—thereby resulting in a stress pattern in the channel region 203 that may be relatively unchanged.

In some illustrative embodiments of the present disclosure, wherein the epitaxial material 222E comprises silicon-germanium, the silicon-germanium ratio may be substantially constant throughout the epitaxial material 222E. A substantially constant silicon-germanium ratio of the material comprising the epitaxial material 222E may be accomplished, for example, by maintaining a substantially constant ratio of the respective flow rates of the gaseous precursor materials that may be supplied to the epitaxy reactor wherein the epitaxial material 222E may be formed. In other illustrative embodiments, the silicon-germanium ratio of the epitaxial material 222E may be "graded," i.e., the ratio may vary over the depth of the material. For example, the germanium content may vary from the bottom of a cavity 221C through the height or thickness 223H of the epitaxial material 222E formed therein, thereby resulting in a "graded" silicon-germanium material ratio. In some illustrative embodiments, a "graded" silicon-germanium material ratio may be obtained by, for example, maintaining the flow rate of a silicon-containing precursor gas to the epitaxy reactor at a substantially constant level, whereas the flow rate of a germanium-containing precursor gas may be varied throughout the epitaxial deposition process. Depending on the specific device strategy, which in some instances may include the level and variation of a residual stress that may be induced in the channel region 203 of the PMOS transistor elements 250P, the flow rate of germanium-containing gaseous precursor may be increased during the epitaxy process, thereby resulting in a lesser amount of germanium at the bottom of a cavity 221C as compared to the top of the epitaxial material 222E formed therein. For other device strategies, the flow rate of germanium-containing precursor gas may be decreased during the epitaxial deposition process, resulting in a greater amount at the bottom of the epitaxial material 222E as compared to the top. Furthermore, silicon-germanium ratio "grading" may in some embodiments be substantially gradual and continuous, whereas in other embodiments "grading" may be substantially discrete—e.g., wherein the epitaxial material 222E may comprise a plurality of individual epitaxially formed layers, each of which may comprise a specific and distinct silicon-germanium ratio that differs from adjacent layers.

In some illustrative embodiments of the present disclosure, the epitaxial material 222E may also be doped in situ during the epitaxial deposition process. For example, appropriate P-type dopant materials for adjusting the conductivity of epitaxial material 222E, such boron, and the like, may be included in the gaseous precursor ambient of the epitaxy reactor, which may thereby be incorporated into the epitaxial material 222E as it is epitaxially formed in a cavity 221C. Furthermore, as with the silicon-germanium material ratio discussed above, the dopant concentration in the epitaxial material 222E may, in some illustrative embodiments, be substantially constant throughout the material, whereas in other embodiments the dopant concentration may be "graded" from the bottom of a cavity 221C through the height or thickness 223H of the epitaxial material 222E formed therein. In yet further illustrative embodiments, the epitaxial material 222E may not be doped in situ during the epitaxy process, but instead, dopants may be introduced into the epitaxial material 222E during a separate dopant implantation process, such as during a separately performed ion implantation, and the like.

After formation of the epitaxial material 222E in the second active region 254P, and the introduction of any dopant materials that may be required by specific process design strategies, a second dielectric material layer 224 may then be formed above the semiconductor device 200, as shown in FIG. 2e. The second dielectric material layer 224 may be formed, in some embodiments, based on a highly conformal material deposition process, such as ALD, LPCVD, and the like. Furthermore, the second dielectric material layer 224 may have a thickness ranging from 2-4 nm, whereas in specific embodiments the thickness may be approximately 3 nm. In some embodiments disclosed herein, the material comprising the second dielectric material layer 224 may be substantially the same as the material comprising the first dielectric layer 211 and the cap layer 208, which, in at least one embodiment may exhibit etch selectively with respect to an interlayer dielectric fill material comprising a metallization layer formed above the semiconductor device 200 during a subsequent manufacturing step. In specific embodiments of the disclosed subject matter, the second dielectric material layer 224 may comprise silicon nitride.

FIG. 2f depicts the illustrative semiconductor device 200 in a further advanced manufacturing stage, wherein portions of the first and second dielectric material layers 211, 224 are selectively removed from above the NMOS transistor elements 250N. As shown in FIG. 2f, an etch mask 225 may be formed above the semiconductor device 200 so as to cover the PMOS transistor elements 250P and to expose the NMOS transistor elements 250N. Thereafter, the horizontal portions of the first and second dielectric material layers 211, 224—i.e., those portions formed above the first active region 254N and the cap layers 208—may be selectively removed based on a suitable etch process 244, such as RIE and the like. However, due to the anisotropic nature of the etch process 244, the vertical portions of the first and second dielectric material layers 211, 224—i.e., those portions formed on the sidewalls of the gate electrode structures 210—may be left substantially in place. After completion of the etch process 244, upper surface portions 226S and 227S of the first active region 254N and the cap layer 208, respectively, may be exposed. Additionally, depending on the etch recipe and the specified process sequence, some portion of the cap layers 208 above the NMOS transistor elements 250N may also be removed during the etch process 244, thereby slightly reducing the thickness thereof. For example, the thickness of the cap layer 208 may be reduced in some illustrative embodiments by approximately 6-8 nm during the etch process 244.

FIG. 2g shows the semiconductor device 200 in a yet further illustrative manufacturing stage, wherein etch mask 225 has been removed from above the NMOS transistor elements 250N. Furthermore, FIG. 2g depicts an epitaxially grown silicon-based semiconductor material 229E that has been formed above the exposed surfaces 226S of the first active region 254N, thereby forming raised source/drain regions of the NMOS transistor elements 250N. Due to the "masking" effect of the second dielectric material layer 224 formed above the PMOS transistor elements 250P, portions of the second dielectric material layer 211 remaining on the sidewalls of the gate electrode structures 210 of NMOS transistor elements 250N, and the cap layers 208 formed thereabove, epitaxially grown material will not be formed in those locations during the process used to form the epitaxial material 229E. As shown in FIG. 2g, the epitaxial material 229E is grown to a height or thickness 230H above the upper surface 226S (see FIG. 2e) of the first active region 254N. As with the epitaxial material 222E formed in the second active region 254P, the silicon-based epitaxial material 229E may comprise, for example, a silicon-based semiconductor material that is substantially similar to the silicon-based material comprising the first active region 254N. For example, in some illustrative embodiments, the material comprising the first active region may be substantially silicon, and the epitaxial material 229E may also be substantially silicon. However, in certain other embodiments, the epitaxial material 229E may comprise a material that is substantially different than the material comprising the first active region 254N. For example, the material comprising the first active region 254N may be substantially silicon, whereas the epitaxial material 229E may comprise a silicon-carbon (SiC) material. In further illustrative embodiments, a plurality of cavities (not shown) may be formed in the first active region 254N—similar to the plurality of cavities 221C formed in the second active region 254P (see FIG. 2d)—and the epitaxial material 229E may thereafter be formed so as to completely fill those cavities, and up to a height or thickness 230H.

In some illustrative embodiments of the present disclosure, a sacrificial dielectric material layer (not shown) comprising, for example, silicon dioxide and the like, may be selectively formed on the portions of the second dielectric material layer 224 remaining on the sidewalls of the gate electrode structures 210 of NMOS transistor elements 250N after performing the anisotropic etch process 244. Depending on the desired process strategy, the thickness of the sacrificial dielectric material layer, when required, may be adjusted as required to obtain the desired size (i.e., width and thickness) of the epitaxial material 229E. In some illustrative embodiments, the thickness of the sacrificial material layer (not shown) may be in the range of 5-8 nm.

Depending on the desired process strategy, the epitaxial material 229E may also be formed so as to induce a stress in the channel regions 203 of the NMOS transistor elements 250N, similar to the epitaxial material 222E formed in the second active region 254P. As is well known to persons having skill in the art, the atoms comprising a silicon-carbon material are smaller than those comprising a material that is substantially silicon. When epitaxially deposited on a substantially silicon substrate, the silicon-carbon atoms take on a lattice structure and orientation identical to those of the substantially silicon substrate. The smaller silicon-carbon atoms comprising the epitaxial material 229E may thereby induce a localized tensile stress on the larger atoms of the adjacent substantially silicon material in the channel regions 203 of the NMOS transistor elements 250N, which, again, may improve the performance of the transistors 250N. It should also be appreciated that, in those embodiments wherein the additional stress-induced enhanced device performance that may be derived from a silicon-carbon epitaxial material 229E in the NMOS transistor elements 250N is not desired, the epitaxial material 229E may comprise a material that substantially matches that of the first active region 254N, thereby resulting in relatively little or no change to the stress pattern of the channel regions 203.

Additionally, as with the silicon-germanium epitaxial material 222E formed in the second active region 254P, the silicon-carbon ratio of the epitaxial material 229E may in some illustrative embodiments be substantially constant throughout the epitaxial material 229E. In other illustrative embodiments, the epitaxial material 229E may be "graded," wherein the silicon-carbon ratio may vary over the depth of the material. Illustrative methods for accomplishing either a constant or "graded" material ratio may be as previously discussed with respect to the epitaxial material 222E above.

As shown in FIG. 2g, an implantation process 245 may be performed so as to adjust the conductivity of the epitaxial material 229E. For example, in some illustrative embodiments, an implantation mask 228 may be formed to cover the PMOS transistor elements 250P and expose the NMOS transistor elements 250N. Thereafter, an implantation process 245, which may comprise, for example, an appropriately designed ion implantation process, may be performed to introduce N-type dopant materials, such as phosphorous, arsenic, and the like, into the epitaxial material 229E. In other illustrative embodiments, doping of the epitaxial material 229E may be accomplished on the basis of an in situ process as described with respect to the epitaxial material 222E above. For in situ doping of the epitaxial material 229E, appropriate N-type dopants may be included in the gaseous precursor ambient of the epitaxy reactor, which may thereby be incorporated into the epitaxial material 229E as it is epitaxially formed above the surfaces 226S of the first active region 254N. Furthermore, similar to the dopant scheme used for the epitaxial material 222E formed in the second active region 254P, the dopant concentration in the epitaxial material 229E may, in some illustrative embodiments, be substantially constant throughout the material, whereas in other embodiments the dopant concentration may be "graded" from the surface 226S through the height or thickness 230H of the epitaxial material 229E.

FIG. 2h depicts a further advanced manufacturing stage of the semiconductor device 200, wherein, in some illustrative embodiments, the height or thickness 223H (see FIG. 2e) of the epitaxial material 222E may be reduced so as to adjust the overall performance characteristics of the PMOS transistor elements 250P. As shown in FIG. 2h, an etch mask 231 may be formed above the NMOS transistor elements 250N, and a substantially anisotropic etch process 246 may be performed to selectively remove portions of the second dielectric material layer 224 from above the epitaxial material 222E. In some illustrative embodiments, the anisotropic etch process 246 may comprise, for example, a reactive ion etch (RIE) process. The etch recipe of the etch process 246 may thereafter be adjusted as required so as to remove an upper portion of the silicon-based epitaxial material 222E, thereby reducing the height of the epitaxial material 222E above the surface 219S (see FIG. 2c) of the second active region 254P from 223H (see FIG. 2e) to a reduced height 232H.

In some illustrative embodiments disclosed herein, the anisotropic etch process 246 may also remove the horizontal portions of the second dielectric material layer 224 formed above the cap layers 208 of the PMOS transistor elements 250P, and furthermore may also slightly reduce the thickness of the cap layers 208. In certain embodiments, the thickness of the cap layers 208 may be reduced by, for example, approximately 4-6 nm during the anisotropic etch process 246.

FIG. 2i shows illustrative the semiconductor device 200 in a yet further advanced manufacturing stage, wherein, in some embodiments, the height or thickness 230H (see FIG. 2g) of the epitaxial material 229E may be similarly reduced so as to adjust the performance characteristics of the NMOS transistor elements 250N. In the manufacturing step illustrated in FIG. 2i, the etch mask 231 has been removed from above the NMOS transistor elements 250N. Furthermore, in those embodiments of the present disclosure wherein a sacrificial dielectric material (not shown) was formed on the sidewalls of the gate electrode structures 210 comprising the NMOS transistor elements 250N so as to adjust the size of the epitaxial material 229E, the sacrificial material layer has also been removed. Thereafter, the etch mask 233 may be formed above the PMOS transistor elements 250P and an appropriately designed anisotropic etch process 247 may be performed so as to remove an upper portion of the silicon-based epitaxial material 229E, thereby decreasing the height of the epitaxial material 229E above the surface 226S (see FIG. 2f) of the first active region 254N from 230H (see FIG. 2g) to a reduced height 234H.

In some embodiments of the present disclosure, the anisotropic etch process 247 may comprise an RIE process, which, when performed, may further reduce the thickness of the cap layers 208 formed above the gate electrode structures 210 of NMOS transistor elements 250N. In certain illustrative embodiments, the thickness of the cap layers 208 may be reduced by approximately 4-6 nm during the anisotropic etch process 247.

FIG. 2j illustrates the semiconductor device 200 in a further advance manufacturing stage, wherein etch mask 233 has been removed from above PMOS transistor elements 250P. As shown in FIG. 2j, a third dielectric material layer 235 may be formed above the transistor elements 250N, 250P, which in some illustrative embodiments may be formed during a deposition process 248. The deposition process 248 may comprise, for example, a highly conformal material deposition process, such as LPCVD, ALD, and the like. Furthermore, the third dielectric material layer 235 may have, in some illustrative embodiments, a thickness ranging from 5-8 nm, whereas in specific embodiments the thickness may be approximately 7 nm. Additionally, the third dielectric material layer 235 may be comprised of substantially the same as the material comprising the first and second dielectric layers 211, 224, as well as the cap layers 208. In at least one illustrative embodiment disclosed herein, the third dielectric material layer 235 may exhibit an etch selectivity with respect to an interlayer dielectric fill material comprising a metallization layer formed above the semiconductor device 200 during a subsequent manufacturing step. In specific embodiments of the disclosed subject matter, the third dielectric material layer 235 may comprise, for example, silicon nitride.

Therefore, FIG. 2j depicts semiconductor device 200 in an illustrative manufacturing stage wherein gate electrode structures 210 comprising transistor elements 250N, 250P may be fully encapsulated by a dielectric material layer stack 236, which may hereinafter be referred to as an encapsulating stack 236. In some illustrative embodiments, encapsulating stack 236 may comprise, for example, the first, second, and third dielectric material layers 211, 224, and 235 formed on the sidewalls of the each gate electrode structure 210. As shown in FIG. 2j, the encapsulating stack 236 may further comprise the cap layer 208 formed above each of the gate electrode structure 210, as well as the third dielectric material layer 235 formed thereabove. As previously noted with respect to the process flow illustrated by FIGS. 2a-2j and described above, in some illustrative embodiments, each of the individual dielectric material layers 208, 211, 224 and 235 comprising the encapsulating stack 236 may comprise the same dielectric material. For example, in one illustrative embodiment, each of the individual dielectric material layers 208, 211, 224 and 235 may be comprised of silicon nitride, and in another illustrative embodiment, each of the layers 208, 211, 224 and 235 may be comprised of silicon dioxide, and the like.

It should be further noted, however, that the dielectric material layers 208, 211, 224 and 235 be combinations of various dielectric materials. In general, however, each of the dielectric material layers 208, 211, 224 and 235 need to be selectively etchable relative to a material that may be used to fill a space between adjacent gate electrode structures 210 that is defined by the third dielectric material layer 235. For example, in one illustrative embodiment, the first and third dielectric material layers 211, 235 may be comprised of silicon nitride, whereas the cap layer 208 and the second dielectric material layer 224 may be comprised of silicon oxynitride, and the like. It should be appreciated that other combinations of dielectric materials and layers may also be possible.

Furthermore, as discussed with respect to FIG. 2k below, in some illustrative embodiments of the presently disclosed subject matter, the encapsulating the 236 may protect the gate electrode structures 210 during subsequent process steps directed to forming, for example, conductive contact elements and the like, and which may comprise appropriately designed wet and/or dry etch processes. Accordingly, depending on specific process design considerations, the various portions of the encapsulating stack 236 may be of sufficient overall thickness so as to withstand any anticipated series of etching steps which may be performed in conjunction with later-performed manufacturing steps.

As shown in FIG. 2j, the sidewall portions 236S of the encapsulating stack 236 may comprise sidewall spacer layers 211, 224 and 235—i.e., the first, second and third dielectric material layers formed on the sidewall of the gate electrode structures 210. Furthermore, the upper portion 236U of the encapsulating stack 236 may comprise the cap layer 208 and the third dielectric material layer 235. Depending on the desired process strategy, the minimum total combined thickness 237T of the sidewall portion 236S of the encapsulating stack 236 may, in some illustrative embodiments, be significantly less than the minimum total combined thickness 238T of the upper portion 236U of the encapsulating stack 236. For example, for those illustrative embodiments wherein anisotropic etch processes are primarily employed in subsequently performed manufacturing steps, the sidewall portions 236S of the encapsulating stack 236 may be influenced by the anisotropic etch processes to a significantly lesser degree than may the upper portions 236U of the encapsulating stack 236, thereby necessitating a lesser sidewall portion thickness 237T as compared to the upper portion thickness 238T. For example, in some illustrative embodiments of the manufacturing stage shown in FIG. 2j, the total combined thickness 237T of the sidewall portion 236S of the encapsulating stack 236 may be in the range of 10-16 nm. On the other hand, the total combined thickness 238T of the upper portion 236U of the encapsulating stack 236 may be on the order of 35-40 nm, so as to provide adequate material thickness to resist the full design complement of anisotropic etch steps that may be later performed.

Figure 2K:
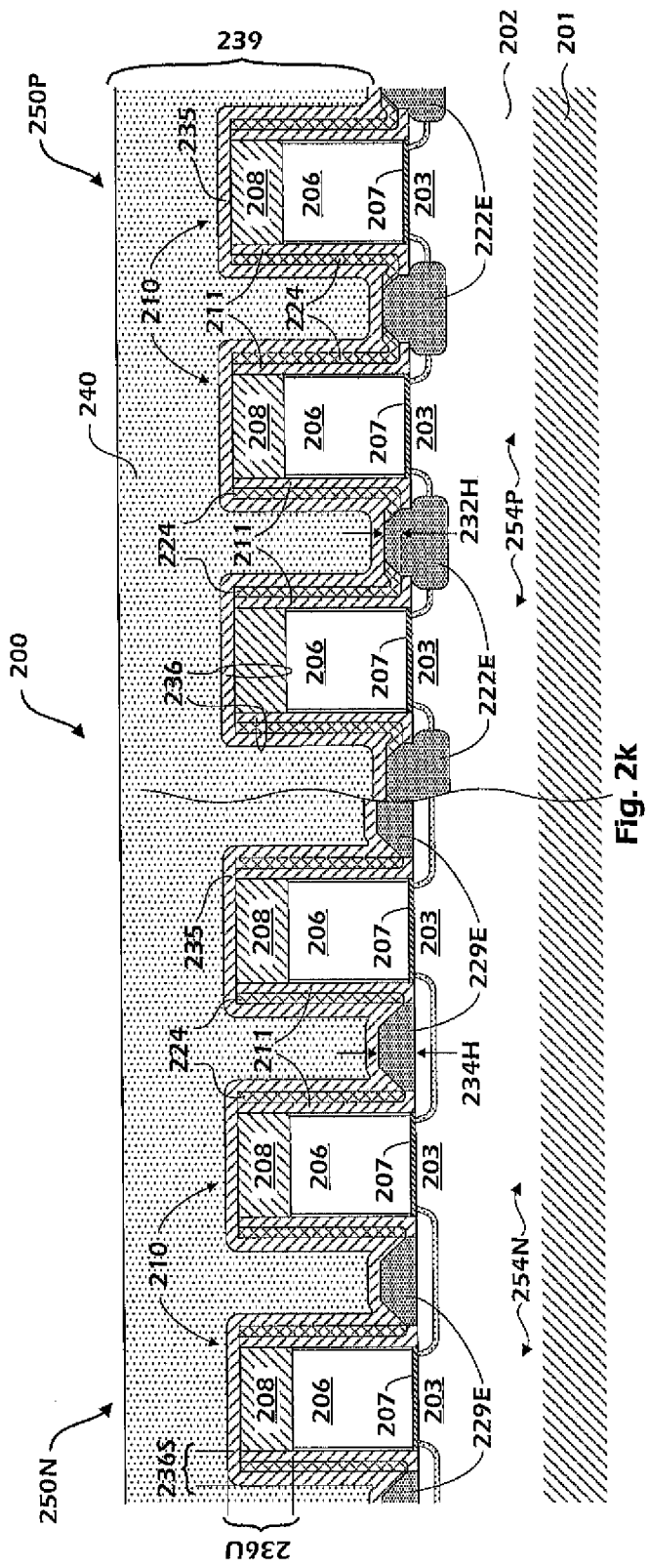

FIG. 2k depicts the semiconductor device 200 in further illustrative manufacturing stage, wherein a metallization layer 239 comprising a dielectric fill material 240 may be formed above the transistor elements 250N, 250P. In some illustrative embodiments, the dielectric fill material 240 may be formed above the transistor elements 250N, 250P so as to completely fill the spaces between adjacent gate electrode structures 210. In certain embodiments, the dielectric fill material 240 may be formed based on a suitable gap fill deposition process such as a spin-on-glass (SOG) technique, and the like.

As discussed previously, in some illustrative embodiments the dielectric fill material 240 may exhibit etch selectivity relative to the encapsulating stack 236. For example, in one illustrative embodiment, wherein the encapsulating stack 236 comprises silicon nitride, the dielectric fill material 240 may be comprised of silicon dioxide. In another illustrative embodiment of the present disclosure, the encapsulating stack 236 may be comprised of silicon dioxide, whereas the encapsulating stack dielectric fill material 240 may comprise silicon nitride. Accordingly, in subsequent manufacturing stages, the dielectric fill material 240 may be selectively removed relative to the encapsulating stack 236 based on an appropriately designed selective etch process, thereby facilitating an integration scheme comprising a process sequence for forming self aligned contact elements.

For example, in some illustrative embodiments, the dielectric fill material 240 formed between adjacent gate electrode structures 210 may be completely removed based on an etch recipe that is selective to the dielectric fill material 240 relative to the encapsulating stack 236, such as a hot phosphoric acid wet etch process and the like, thereby exposing the third dielectric material layer 235. Thereafter, the epitaxial materials 222E and/or 229E comprising the raised source/drain regions of the transistor elements 250P and/or 250N, respectively, may be exposed by performing an anisotropic etch process, such as, for example, a reactive ion etch (RIE), thereby selectively removing the third dielectric material layer 235 from above the epitaxial materials 222E and/or 229E. A salicidation process may then be performed utilizing process strategies that are well-known to those having skill in the art so as to form metal silicide contact regions in an upper portion of the epitaxial materials 222E and/or 229E. Thereafter, depending on the device process strategies, an appropriate conductive fill material, such as tungsten or copper, and the like may be formed to completely fill the openings between adjacent gate electrode structures 210, thus providing suitably sized electrical contact elements, and thereby providing electrical connectivity between the transistor elements 250P and/or 250N, and one or more metallization layers formed above the semiconductor device 200.

As a result, the subject matter disclosed herein provides techniques and corresponding semiconductor devices which may enable forming adequately sized conductive contact elements to a plurality of semiconductor devices, such as transistor elements and the like, while facilitating the use of aggressively spaced gate electrode structures. Furthermore, the process sequence disclosed herein is highly compatible with conventional process strategies for forming the transistor structures, thereby also enabling the integration of various desired stress-inducing mechanisms which may enhance overall device performance characteristics, such as stress memorization techniques, stressed overlayers, and the like. Furthermore, the process strategies disclosed herein are compatible with both replacement gate (i.e., gate-last) and gate-first integration schemes. For example, in some illustrative embodiments, when a replacement gate, or gate-last, process strategy is employed, conventional gate electrode structures 210, such as poly/SiON configurations and the like, may be first formed, as shown in FIG. 2a, and thereafter removed and replaced by high-k dielectric metal gate (HK/MG) gate electrode structures (i.e., gate-last) on the basis of a relatively small number of additional masking steps, thereby significantly reducing the overall degree of process complexity. In other illustrative embodiments, a gate-first device strategy may be employed, wherein the gate electrode structures 210 as shown in FIG. 2a may either comprise conventional poly/SiON gate electrode configurations, or more sophisticated HK/MG gate electrode configurations in accordance with more advanced semiconductor device technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first gate electrode structure and a second gate electrode structure above a semiconductor substrate;
   forming a first layer of a first dielectric material adjacent to or in contact with sidewalls of each of said first and second gate electrode structures;
   forming a second layer of a second dielectric material on said first layer; and
   forming a third layer of a third dielectric material on said second layer, wherein forming said third layer further comprises forming a first horizontal portion of said third layer above a surface of said semiconductor substrate between said first and second gate electrode structures, each of said first, second and third dielectric materials comprising a same dielectric material.

2. The method of claim 1, wherein forming said first and second gate electrode structures comprises forming said first gate electrode structure adjacent to said second gate electrode structure and having a gate electrode pitch of less than 100 nm.

3. The method of claim 1, further comprising forming a cap layer comprising a fourth dielectric material above each of said first and second gate electrode structures prior to forming said first layer.

4. The method of claim 3, wherein forming said third layer further comprises forming a second horizontal portion of said third layer above said cap layer.

5. The method of claim 1, further comprising performing at least one etching process to define an opening in said first horizontal portion of said third layer to expose a surface of said semiconductor substrate.

6. The method of claim 5, further comprising forming a conductive material in said opening.

7. A method, comprising:
forming a plurality of first gate electrode structures in and above a first active region of a semiconductor substrate;
forming a plurality of second gate electrode structures above a second active region of said semiconductor substrate;
forming a first layer of a first dielectric material above said first and second active regions of said semiconductor substrate, wherein at least a first portion of said first layer covers sidewall surfaces of each of said first and second gate electrode structures;
forming a second layer of a second dielectric material above said first layer, wherein at least a first portion of said second layer covers said first portion of said first layer; and
forming a third layer of a third dielectric material above said first and second layers, wherein at least a first portion of said third covers said first portions of said first and second layers, each of said first, second and third dielectric materials comprise a same dielectric material.

8. The method of claim 7, wherein forming at least two of each of said plurality of first and second gate electrode structures comprises forming a cap layer comprising a fourth dielectric material above a gate electrode material.

9. The method of claim 7, wherein forming at least one of each of said plurality of first and second gate electrode structures comprises forming a dielectric material liner on said sidewall surfaces thereof.

10. The method of claim 7, wherein forming at least one of said first, second and third layers comprises performing a conformal material deposition process.

11. The method of claim 7, wherein said same dielectric material exhibits an etch selectivity relative to a dielectric fill material comprising a metallization layer formed above at least one of each of said plurality of first and second gate electrode structures.

12. The method of claim 7, further comprising performing an epitaxial deposition process to selectively form an epitaxial semiconductor material to a height above an upper surface of said second active region adjacent to at least one of said plurality of second gate electrode structures and forming said second layer of said second dielectric material above said epitaxial semiconductor material.

13. The method of claim 12, wherein selectively forming said epitaxial semiconductor material comprises exposing at least a portion of said upper surface of said second active region by selectively removing said first layer formed thereabove.

14. The method of claim 13, further comprising forming at least one cavity in said second active region adjacent at least one of said plurality of second gate electrode structures prior to selectively forming said epitaxial semiconductor material.

15. The method of claim 7, further comprising performing an epitaxial deposition process to selectively form an epitaxial semiconductor material to a height above an upper surface of said first active region adjacent to at least one of said plurality of first gate electrode structures and forming said third layer above said epitaxial semiconductor material.

16. The method of claim 7, wherein same dielectric material comprises silicon and nitrogen.

17. The method of claim 8, wherein said fourth dielectric material comprises said same dielectric material as said first, second and third dielectric materials.

18. The method of claim 7, further comprising:
prior to forming said second layer, forming an etch stop layer on said first layer above at least one of said first and second active regions;
after forming said etch stop layer, forming a sacrificial material layer above said at least one of said first and second active regions;
performing an annealing process in the presence of said sacrificial material layer to induce a residual stress in said at least one of said first and second active regions; and
removing said sacrificial material layer from above said at least one of said first and second active regions by using said etch stop layer as an etch stop.

19. The method of claim 1, wherein same dielectric material comprises silicon and nitrogen.

20. The method of claim 3, wherein said fourth dielectric material comprises said same dielectric material as said first, second and third dielectric materials.

21. A method, comprising:
forming a plurality of first gate electrode structures in and above a first active region of a semiconductor substrate;
forming a plurality of second gate electrode structures above a second active region of said semiconductor substrate;
forming a first layer of a first dielectric material above said first and second active regions of said semiconductor substrate, wherein at least a first portion of said first layer covers sidewall surfaces of each of said first and second gate electrode structures;
exposing an upper surface of said second active region adjacent to at least one of said plurality of second gate electrode structures by selectively removing a second portion of said first layer formed thereabove;
performing an epitaxial deposition process to selectively form an epitaxial semiconductor material to a height above said exposed upper surface portion of said second active region;
forming a second layer of a second dielectric material above said first layer and above said epitaxial semiconductor material, wherein at least a first portion of said second layer covers said first portion of said first layer; and
forming a third layer of a third dielectric material above said first and second layers, wherein at least a first portion of said third covers said first portions of said first and second layers.

22. The method of claim 21, further comprising forming at least one cavity in said second active region adjacent to at least one of said plurality of second gate electrode structures prior to selectively forming said epitaxial semiconductor material.

23. The method of claim 21, further comprising reducing said height of said epitaxial semiconductor material and forming said third layer above said epitaxial semiconductor material having said reduced height.

24. The method of claim 21, wherein said epitaxial semiconductor material comprises at least one of silicon, germanium, and silicon-carbon.

25. The method of claim 21, wherein performing said epitaxial deposition process comprises introducing a dopant species having one of an N-type and a P-type conductivity into said epitaxial semiconductor material in situ during said epitaxial deposition process.

26. The method of claim 21, further comprising performing a second epitaxial deposition process to selectively form a second epitaxial semiconductor material to a second height above an upper surface of said first active region adjacent to at least one of said plurality of first gate electrode structures and forming said third layer above said second epitaxial semiconductor material.

27. The method of claim 26, further comprising performing an implantation process to introduce a dopant species having a one of an N-type and a P-type conductivity into said second epitaxial semiconductor material prior to forming said third layer.

* * * * *